United States Patent [19]

Nakamura et al.

[11] Patent Number: 5,777,349
[45] Date of Patent: Jul. 7, 1998

[54] SEMICONDUCTOR LIGHT EMITTING DEVICE

[75] Inventors: Junichi Nakamura; Hiroshi Nakatsu, both of Tenri, Japan

[73] Assignee: Sharp Kabushiki Kaisha, Osaka, Japan

[21] Appl. No.: 678,954

[22] Filed: Jul. 12, 1996

[30] Foreign Application Priority Data

Mar. 22, 1996 [JP] Japan ................... 8-066879

[51] Int. Cl.$^6$ ........................................ H01L 33/00
[52] U.S. Cl. .................... 257/94; 257/96; 257/97; 257/101; 257/103; 372/45; 372/46; 372/47
[58] Field of Search ........................ 257/94, 96, 97, 257/101, 103; 372/45, 46, 47

[56] References Cited

U.S. PATENT DOCUMENTS

| | | | |
|---|---|---|---|
| 5,138,404 | 8/1992 | Ishikawa et al. | 257/90 X |
| 5,539,239 | 7/1996 | Kawazu et al. | 257/97 X |
| 5,600,158 | 2/1997 | Noto et al. | 372/45 X |

FOREIGN PATENT DOCUMENTS

| | | | |
|---|---|---|---|
| 0540799 | 5/1993 | European Pat. Off. | 257/96 |
| 1-184972 | 7/1989 | Japan . | |
| 5-275740 | 10/1993 | Japan . | |
| 6-296040 | 10/1994 | Japan . | |

OTHER PUBLICATIONS

Tiwari et al, "Empirical Fit to Band Discontinuities and Barrier Heights in III–V Alloy Systems", Appl. Phys. Letter, vol. 60, No. 5, pp. 630–632, 1992.

Crawford, "AlInGaP LED Lamp with High Luminance", Publication of Yokogawa Hewlett Packard, 1993, pp. 1–8.

*Primary Examiner*—William Mintel
*Attorney, Agent, or Firm*—Nixon & Vanderhye, P.C.

[57] ABSTRACT

A semiconductor light emitting device includes: a compound semiconductor substrate of a first conductive type; a multilayer structure formed on the compound semiconductor substrate, the multilayer structure including at least an active layer for emitting light, a lower cladding layer of the first conductive type and an upper cladding layer of a second conductive type with the active layer interposed therebetween; an intermediate layer of the second conductive type formed on the multilayer structure; and a current diffusion layer of the second conductive type formed on the intermediate layer. The intermediate layer alleviates at least one of a lattice mismatching between the upper cladding layer and the current diffusion layer and a difference in energy positions at a lower end of a conduction band and/or an upper end of a valence band in an energy band profile which is exhibited before forming a junction between the upper cladding layer and the current diffusion layer.

15 Claims, 14 Drawing Sheets

FIG.2A
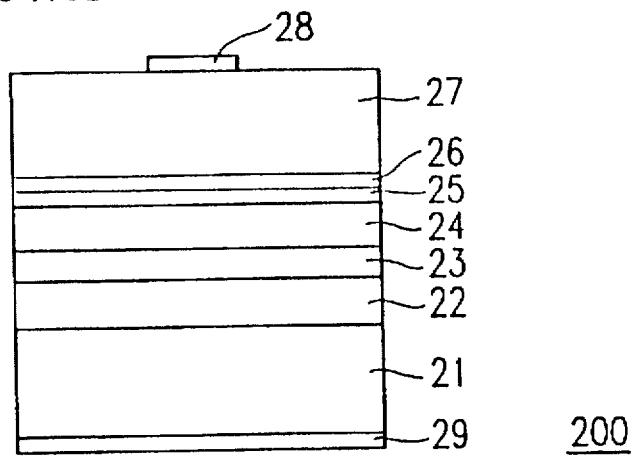
FIG.2B
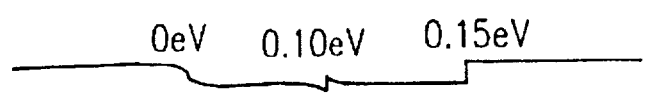
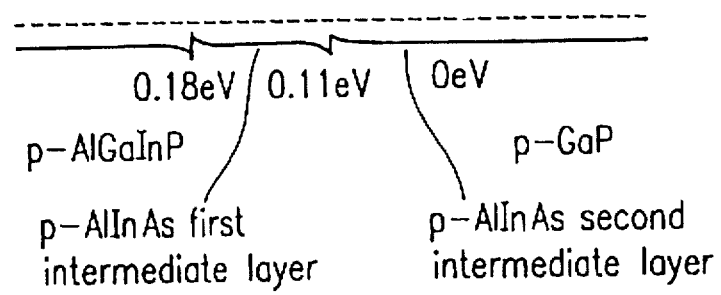

FIG.5A
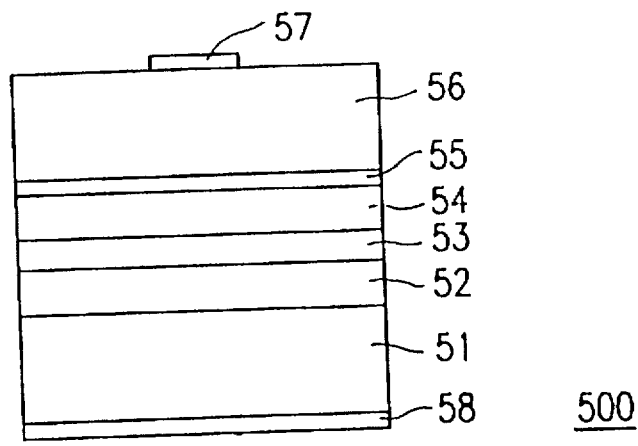
FIG.5B
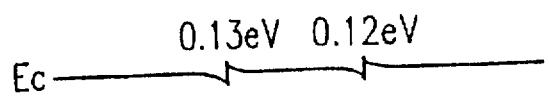
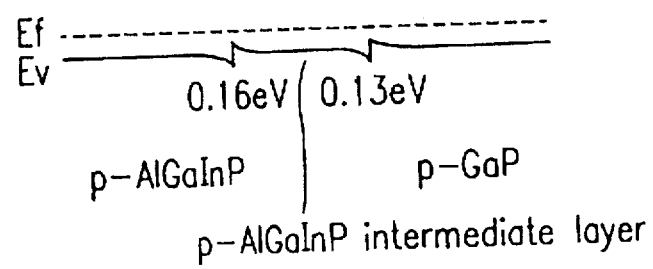

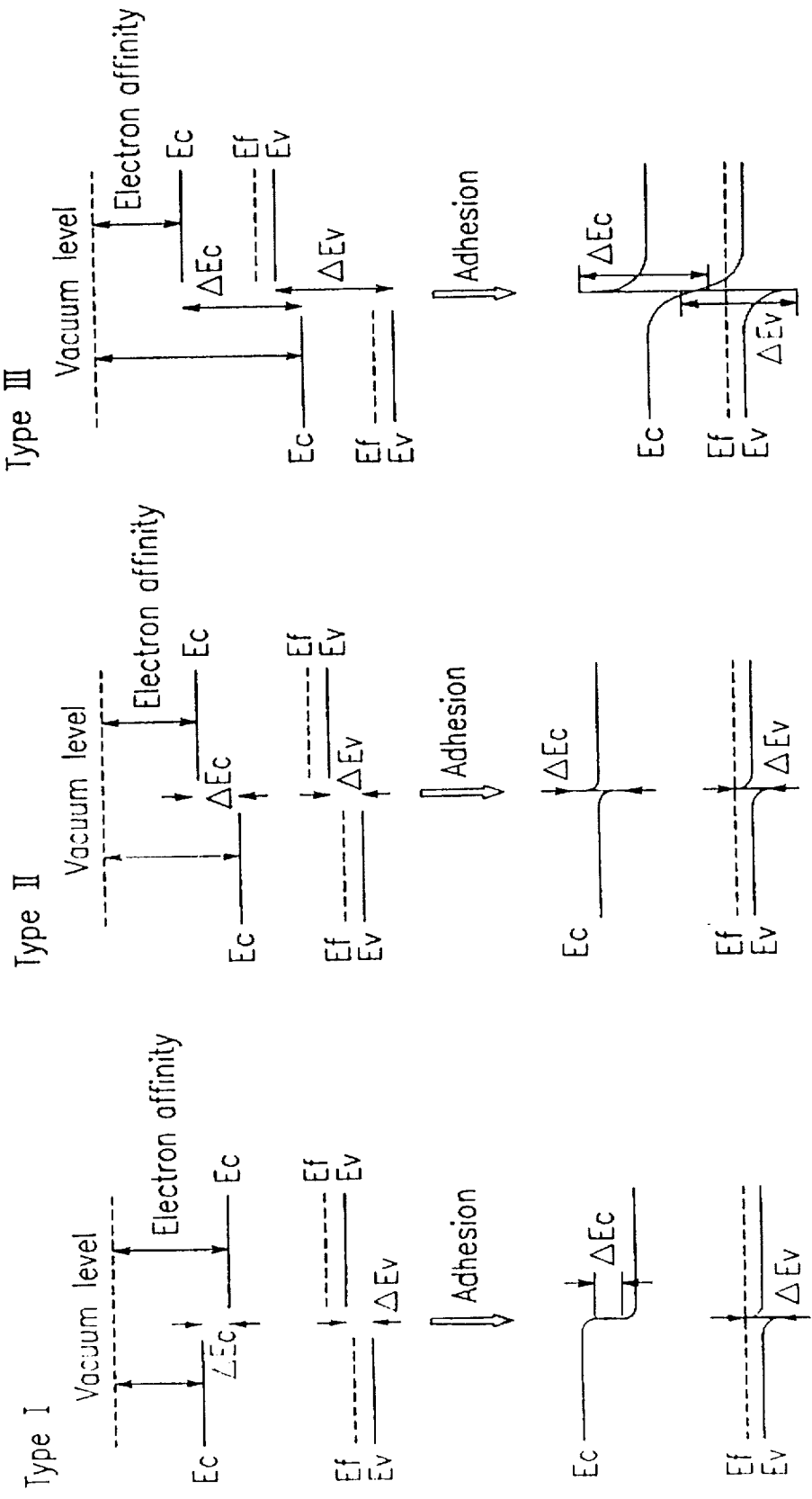
FIG. 13A (PRIOR ART) Type I
FIG. 13B (PRIOR ART) Type II
FIG. 13C (PRIOR ART) Type III FIG.15B (PRIOR ART)
With an intermediate bandgap layer
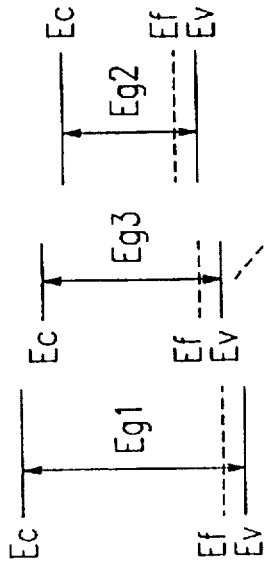
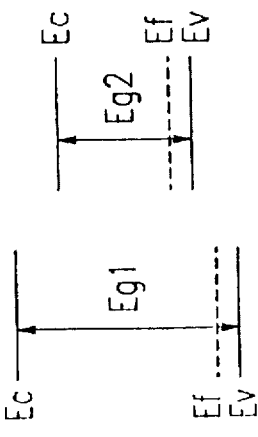
FIG.15A (PRIOR ART)
Without an intermediate bandgap layer
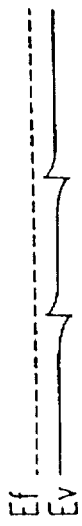
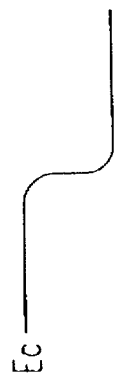 

SEMICONDUCTOR LIGHT EMITTING DEVICE

BACKGROUND OF THE INVENTION

1. Field of the Invention

The present invention relates to a semiconductor light emitting device. In particular, the present invention relates to a semiconductor light emitting device produced using a semiconductor material which generates discontinuities (notches) in an energy band profile at junction interfaces when a multilayer structure is formed, such as AlGaInP type materials.

2. Description of the Related Art

An AlGaInP type material has the largest direct transition type band gap among the III–V group compound semiconductor materials, except nitrides, so that it is considered desirable as a material for a light emitting device of a wavelength of 0.5 to 0.6 μm band. In particular, a pn junction type light emitting diode (hereinafter, referred to as an LED) is promising. The pn junction type LED is obtained by using GaAs as a substrate on which a light emitting section (a multilayer structure including an active layer) formed of an AlGaInP type material, lattice-matched with GaAs, is grown. In such an LED, it is possible to emit brighter light in a wavelength range corresponding from red color to green color when compared with a conventional device formed of indirect transition type material such as GaP and GaAsP.

In order to form a bright LED, it is important to improve the efficiency of current injection to the light emitting section and to allow light to efficiently come out of the device, in addition to enhancement of the light emission efficiency.

FIG. 11 is a cross sectional view of an LED 1100 including a light emitting section formed of an AlGaInP type material produced by a conventional technique.

The LED 1100 includes an n-type GaAs substrate 1110. On the n-type GaAs substrate 1110 are sequentially deposited an n-type AlGaInP lower cladding layer 1120, an AlGaInP active layer 1130, a p-type AlGaInP upper cladding layer 1140 and a p-type GaP current diffusion layer 1150 in this order. Furthermore, a p-type electrode 1160 is formed on the p-type GaP current diffusion layer 1150, and an n-type electrode 1170 is formed on the lower face of the n-type GaAs substrate 1110. Thus, the LED 1100 is constituted.

In the LED 1100, p-type GaP is used as the material for the current diffusion layer 1150. The current diffusion 1150 can be formed of p-type AlGaAs in place of the p-type GaP. However, the p-type GaP has a larger optical transmittance and a larger electrical conductivity than the p-type AlGaAs. As a result, when GaP is used to form the current diffusion layer 1150, light can be allowed to exit more efficiently, and diffusion of current can be enhanced. Furthermore, Al is not included in the composition of the current diffusion layer 1150, which results in a high reliability being ensured for a long period of time.

In the above-mentioned LED 1100, the p-type GaP current diffusion layer 1150 is formed on the p-type AlGaInP cladding layer 1140 by crystal growth. However, crystallinity of the p-type GaP current diffusion layer 1150 is not sufficiently satisfactory due to difference in lattice constants between the p-type GaP current diffusion layer 1150 and the p-type AlGaInP cladding layer 1140. As a result, problems of an insufficient degree of current diffusion and a low optical transmittance arise.

In order to solve these problems, for example, Japanese Laid-Open Patent Publication No. 6-296040 proposes the following LED and a method for producing such an LED. FIGS. 12A to 12C are cross sectional views illustrating the structure of the LED 1200 and the production process thereof disclosed in the publication.

In producing the LED 1200, as shown in FIG. 12A, an n-type AlGaInP lower cladding layer 1220, an AlGaInP active layer 1230 and a p-type AlGaInP upper cladding layer 1240 are sequentially deposited on an n-type GaAs substrate 1210 in this order. The n-type lower cladding layer 1220, the active layer 1230 and the p-type upper cladding layer 1240 constitute a multilayer structure including a light emitting section of the LED 1200.

Then, a p-type GaP cap layer 1250 is grown on the p-type AlGaInP upper cladding layer 1240. Then, a p-type GaP substrate 1260 is disposed on the p-type GaP cap layer 1250 so that the crystal axis of the former is matched with that of the latter. Furthermore, a weight 1270 of an appropriate weight is placed on the p-type GaP substrate 1260, and then a thermal treatment is performed at about 650° C. in an H₂ atmosphere so that the Gap cap layer 1250 adheres to the p-type GaP substrate 1260. After forming the junction, the p-type GaP substrate 1260 functions as a current diffusion layer 1260 of the LED 1200.

Thereafter, as shown in FIG. 12B, a p-type electrode 1280 is formed on the p-type GaP current diffusion layer 1260 by film deposition process and etching. The p-type electrode 1280 is processed in a circle, for example. Then, the n-type GaAs substrate 1210 is etched to a thickness of about 10 μm, and then an n-type electrode 1290 is formed across the entire lower face of the n-type GaAs substrate 1210 (see FIG. 12B).

Then, as shown in FIG. 12C, the n-type electrode 1290 and the GaAs substrate 1210 are etched into suitable shapes by photolithography to obtain the LED 1200.

In the above-mentioned LED 1200, the p-type GaP substrate to function as the current diffusion layer 1260 is directly formed on the GaP cap layer 1250. Thus, The p-type GaP current diffusion layer 1260 can be relatively easily formed, thus improving productivity. Furthermore, by using a substrate with a satisfactory crystallinity, a p-type GaP current diffusion layer 1260 with a satisfactory crystallinity can be obtained, whereby light is allowed to efficiently exit. Moreover, by patterning the n-type GaAs substrate 1210 and the n-type electrode 1290 in suitable shapes, "windows" for allowing light to exit from the bottom of the device are formed. Thus, light can exit more efficiently.

In the LED 1100 having the aforementioned structure, the p-type GaP current diffusion layer 1150 is formed on the p-type AlGaInP upper cladding layer 1140. At this time, large notches, i.e., discontinuities, are generated in a energy band profile at the interface between the p-type AlGaInP upper cladding layer 1140 and the p-type GaP current diffusion layer 1150. On the other hand, in the LED 1200, the p-GaP current diffusion layer 1260 is formed on the p-type AlGaInP upper cladding layer 1240 via the p-type GaP cap layer 1250. In this case as well, discontinuities (notches) are generated in the energy band profile at the junction interfaces between the p-type AlGaInP forming the upper cladding layer 1240 and the p-type GaP forming the cap layer 1250 and the current diffusion layer 1260.

The generation of notches in the energy band profile will be described with reference to FIGS. 13A to 13C below.

Heterojunction between semiconductor materials is generally classified to three types, i.e., Type I, Type II and Type III, based on the positional relationship in an energy band before the junction formation. FIGS. 13A, 13B, and 13C show energy band profiles before and after the junction formation for Types I, II and III, respectively. In either case, discontinuous portions, i.e., notches, are generated in energy band profiles in the vicinity of junction interfaces after the formation thereof.

Hereinafter, the energy levels at the lower end (i.e., the bottom) of the conduction band $E_c$ and the upper end (i.e., the top) of the valence band $E_v$ when vacuum level is set as the standard are referred to as "energy positions" at the lower end (the bottom) of the conduction band $E_c$ and the upper end (the top) of the valence band $E_v$. At this time, a height of a notch which appears at the lower end of the conduction band $E_c$ after the junction formation corresponds to the difference ($\Delta E_c$) in the energy positions at the lower end of the conduction bands of two materials before the junction formation. Similarly, a height of a notch which appears at the upper end of the valence band $E_v$ after the junction formation corresponds to the difference ($\Delta E_v$) in the energy positions at the upper ends of the valence bands of two materials before the junction formation. The differences in the energy positions determining the height of the notches can be obtained, for example, from the energy position relationship obtained by Sandip Tiwari et al. described in Appl. Phys. Lett., Vol. 60, No.5, pp.630–632 (1992).

In the above-mentioned LED 1100, the p-type GaP current diffusion layer 1150 is formed on the p-type AlGaInP upper cladding layer 1140. The generation of large notches, i.e. discontinuities, in the energy band profiles at the junction interface between the p-type AlGaInP upper cladding layer 1140 and the p-type GaP current diffusion layer 1150 will be described with reference to FIGS. 14A to 14C.

In the case of the junction between a p-type $(Al_xGa_{1-x})_{0.51}In_{0.49}P$ (e.g., X=1) and the p-type GaP, the respective energy band profiles before the junction formation exhibits a positional relationship as shown in FIG. 14A due to the difference in electron affinity. This corresponds to Type II shown in FIG. 13B. When the p-type $(Al_xGa_{1-x})_{0.51}In_{0.49}P$ and the p-type GaP having such a positional relationship adheres to each other, the energy band profile becomes as shown in FIG. 14B, showing that notches are generated at the lower end of the conduction band $E_c$ and the upper end of the valence band $E_v$. More specifically, the heights of the notches in this case is 0.25 eV at the lower end of the conduction band and 0.29 eV at the upper end of the valence band.

When such notches are generated in the energy band profiles, the following phenomenon occurs.

Since a positive bias is applied when operating the completed LED, holes (h) are supplied from the right and electrons (e) are supplied from the left, respectively, to the interface in the energy band profile, as shown in FIG. 14C. Although more than half of the supplied electrons are recombined with the holes in the AlGaInP active layer, the rest of the electrons overflow and reach the interface between the p-type AlGaInP cladding layer and the p-type GaP current diffusion layer. Since the notches at the lower end of the conduction band $E_c$ present in the junction interface functions as an energy barrier with respect to the electrons which have reached the interface, the electrons are accumulated in the junction interface. On the other hand, since the notches at the upper end of the valence band $E_v$ function as an energy barrier with respect to the holes, i.e., the major carriers in the vicinity of the interface, the holes are trapped there. As a result, as schematically shown in FIG. 14C, recombination occurs between a number of electrons and holes at the junction interface.

Furthermore, the lattice constants of $(Al_xGa_{1-x})_{0.51}In_{0.49}P$ and GaP are 5.65 Å and 5.45 Å, respectively. Thus, the former and the latter are in lattice matching. As a result, a number of interface levels are present in the interface between the p-type AlGaInP and the p-type GaP. The presence of the interface levels promote the recombination at the junction interface.

In this manner, the notches present in the energy band profiles at the interface between the p-type AlGaInP and the p-type GaP cause a number of carriers to be recombined at the junction interface. By such recombination, the number of holes to be supplied is substantially reduced, thus reducing the injection efficiency of carriers to the active layer. As a result, the light emission efficiency is deteriorated in the conventionally constructed semiconductor light emitting device (LED). Furthermore, since the notches present in the energy band profile at the junction interface function as a barrier with respect to carrier transfer, a voltage value (an operating voltage value) necessary to emit light out of the LED is increased.

In order to prevent the notches from being generated in the energy band profile at the junction interface, an intermediate layer formed of a suitable material is conventionally inserted in the junction interface in accordance with the size of the band gap (i.e., difference in an energy level between the upper end of the valence band and the lower end of the conduction band). For example, when the sizes of band gaps of two materials to be adhered with each other to form the junction are Eg1 and Eg2 (Eg1>Eg2), respectively, a layer (intermediate band gap layer) formed of a material having a band gap Eg3 satisfying the inequality Eg1>Eg3>Eg2 is inserted in the junction interface. Thus, the size of the notches can be reduced.

In the case of the adhesion of two layers having band gaps of Eg1 and Eg2, respectively, a large notch is generated in the energy band profile after the adhesion and the junction formation when an intermediate band gap layer is not provided, as shown in FIG. 15A. On the other hand, when the two materials are adhered to each other with the intermediate band gap layer inserted therebetween, notches are distributed to two interfaces of the intermediate band gap layer, as shown in FIG. 15B. The size of the generated notches is reduced.

However, in the conventional method which only pays attention to the size of the band gap Eg, a sufficient notch reduction effect may not be obtained due to the positional relationship of the energy band (energy positional relationship of the upper end of the valence band and the lower end of the conduction band) of two materials.

SUMMARY OF THE INVENTION

The semiconductor light emitting device of the present invention includes: a compound semiconductor substrate of a first conductive type; a multilayer structure formed on the compound semiconductor substrate, the multilayer structure including at least an active layer for emitting light, a lower cladding layer of the first conductive type and an upper cladding layer of a second conductive type with the active layer interposed therebetween; an intermediate layer of the second conductive type formed on the multilayer structure; and a current diffusion layer of the second conductive type formed on the intermediate layer. The intermediate layer alleviates at least one of a lattice mismatching between the upper cladding layer and the current diffusion layer and a difference in energy positions at a lower end of a conduction band and/or an upper end of a valence band in an energy band profile which is exhibited before forming a junction between the upper cladding layer and the current diffusion layer.

The intermediate layer can include a plurality of layers.

In one embodiment, an energy position at a lower end of a conduction band of the intermediate layer before the junction formation is positioned between (i) the energy position at the lower end of the conduction band of the upper cladding layer before the junction formation and (ii) the energy position at the lower end of the conduction band of the current diffusion layer before the junction formation. Alternatively or additionally, an energy position at an upper end of a valence band of the intermediate layer before the junction formation is positioned between (i) the energy position at the upper end of the valence band of the upper cladding layer before the junction formation and (ii) the energy position at the upper end of the valence band of the current diffusion layer before the junction formation.

In another embodiment, the intermediate layer is formed of a plurality of layers, from a first intermediate layer in contact with the upper cladding layer, to an n-th intermediate layer (n>1) in contact with the current diffusion layer; and compared with a (k+1)-th intermediate layer, an energy position at a lower end of a conduction band of a k-th intermediate layer ($1 \leq k \leq (n-1)$) before the junction formation is closer to an energy position at the lower end of the conduction band of the upper cladding layer before the junction formation. Alternatively or additionally, an energy position at an upper end of a valence band of the k-th intermediate layer before the junction formation is closer to the energy position at the upper end of the valence band of the upper cladding layer before the junction formation.

In still another embodiment, a lattice constant of the intermediate layer is a value between a lattice constant of the upper cladding layer and a lattice constant of the current diffusion layer.

In still another embodiment, the intermediate layer is formed of a plurality of layers from a first intermediate layer in contact with the upper cladding layer to an n-th intermediate layer (n>1) in contact with the current diffusion layer; and a value of a lattice constant of a k-th intermediate layer ($1 \leq k \leq (n-1)$) is closer to a value of a lattice constant of the upper cladding layer, compared with a value of a lattice constant of a (k+1)-th intermediate layer.

In still another embodiment, an energy position at a lower end of a conduction band of the intermediate layer before the junction formation is positioned between (i) the energy position at the lower end of the conduction band of the upper cladding layer before the junction formation and (ii) the energy position at the lower end of the conduction band of the current diffusion layer before the junction formation. Alternatively or additionally, an energy position at an upper end of a valence band of the intermediate layer before the junction formation is positioned between (i) the energy position at the upper end of the valence band of the upper cladding layer before the junction formation and (ii) the energy position at the upper end of the valence band of the current diffusion layer before the junction formation. A lattice constant of the intermediate layer is a value between a lattice constant of the upper cladding layer and a lattice constant of the current diffusion layer.

In still another embodiment, the intermediate layer is formed of a plurality of layers, from a first intermediate layer in contact with the upper cladding layer, to an n-th intermediate layer (n>1) in contact with the current diffusion layer; and compared with a (k+1)-th intermediate layer, an energy position at a lower end of a conduction band of a k-th intermediate layer ($1 \leq k \leq (n-1)$) before the junction formation is closer to the energy position at the lower end of the conduction band of the upper cladding layer before the junction formation and/or an energy position at an upper end of a valence band of the k-th intermediate layer before the junction formation is closer to the energy position of the upper end of the valence band of the upper cladding layer before the junction formation. A value of a lattice constant of the k-th intermediate layer is closer to a value of a lattice constant of the upper cladding layer.

In still another embodiment, a composition of the intermediate layer is sequentially changed from a composition of the upper cladding layer to a composition of the current diffusion layer.

In one embodiment, the multilayer structure is formed of an AlGaInP type compound semiconductor material, the intermediate layer is formed of an AlInAs type compound semiconductor material, and the current diffusion layer is formed of an AlGaP type compound semiconductor material.

In another embodiment, the multilayer structure is formed of an AlGaInP type compound semiconductor material, the intermediate layer is formed of a GaAsP type compound semiconductor material, and the current diffusion layer is formed of an AlGaP type compound semiconductor material.

In still another embodiment, both the multilayer structure and the intermediate layer are formed of AlGaInP type compound semiconductor materials, and the current diffusion layer is formed of an AlGaP type compound semiconductor material.

Preferably, a carrier concentration of the intermediate layer is in the range from about $1 \times 10^{17}$ cm$^{-3}$ to about $1 \times 10^{19}$ cm$^{-3}$.

Preferably, a thickness of the intermediate layer is in the range from about 0.01 μm to about 5 μm.

Thus, the invention described herein makes possible the advantages of providing a semiconductor light emitting device having a reduced operating voltage and an improved light output characteristic by reducing notches to be generated at the junction interface in the energy band profile and/or reducing interface levels between the cladding layer and the current diffusion layer to raise the efficiency of injection of carriers to the active layer, and by raising crystallinity of the current diffusion layer to improve current diffusion in the current diffusion layer and to allow light to more efficiently exit.

This and other advantages of the present invention will become apparent to those skilled in the art upon reading and understanding the following detailed description with reference to the accompanying figures.

BRIEF DESCRIPTION OF THE DRAWINGS

FIG. 2A is a cross sectional view illustrating a structure of a semiconductor light emitting device in a second embodiment of the present invention.

FIG. 2B is a schematic view illustrating an energy band profile from the upper cladding layer to the current diffusion layer of the semiconductor light emitting device in the second embodiment of the present invention.

FIG. 5A is a cross sectional view illustrating a structure of a semiconductor light emitting device in a fifth embodiment of the present invention.

FIG. 5B is a schematic view illustrating an energy band profile from the upper cladding layer to the current diffusion layer of the semiconductor light emitting device in the fifth embodiment of the present invention.

FIGS. 13A to 13C are schematic views illustrating energy band profiles for Type I, II and III of semiconductor materials before and after the junction formation.

FIGS. 15A and 15B are views of energy band profiles illustrating functions of an intermediate band gap layer formed by a conventional technique.

DESCRIPTION OF THE PREFERRED EMBODIMENTS

Hereinafter, the present invention will be described by way of preferred embodiments with reference to the accompanying drawings.

First Embodiment

Figure 1A:
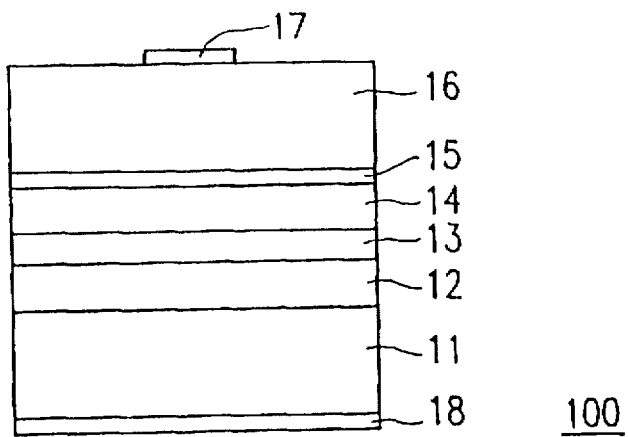
FIG. 1A is a cross sectional view illustrating a structure of a semiconductor light emitting device in a first embodiment of the present invention.
Figure 1B:
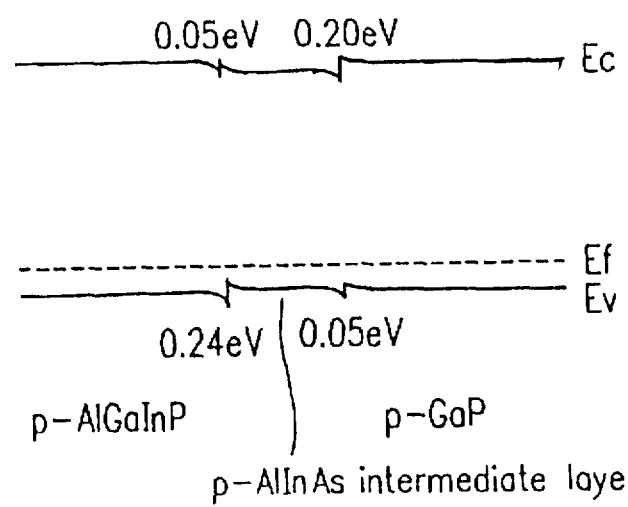
FIG. 1B is a schematic view illustrating an energy band profile from the upper cladding layer to the current diffusion layer of the semiconductor light emitting device in the first embodiment of the present invention.

A light emitting diode (LED) 100 will be described with reference to FIGS. 1A and 1B as a semiconductor light emitting device in a first embodiment of the present invention. FIG. 1A is a cross sectional view illustrating the structure of the LED 100. FIG. 1B is a schematic view illustrating an energy band profile at the junction interface of the multilayer structure from an upper cladding layer to a current diffusion layer in the LED 100.

As shown in FIG. 1A, in the LED 100, an n-type $(Al_xGa_{1-x})_{0.51}In_{0.49}P$ ($0 \leq X \leq 1$) lower cladding layer 12 (e.g., x=1.0 and a thickness of about 1.0 μm), $(Al_xGa_{1-x})_{0.51}In_{0.49}P$ ($0 \leq X \leq 1$) active layer 13 (e.g., x=0.3 and a thickness of about 0.5 μm) and a p-type $(Al_xGa_{1-x})_{0.51}In_{0.49}P$ ($0 \leq X \leq 1$) upper cladding layer 14 (e.g., x=1.0 and a thickness of about 1.0 μm) are sequentially formed on an n-type GaAs substrate 11 in this order. The n-type AlGaInP lower cladding layer 12 is doped with Si so that the carrier concentration becomes about $5 \times 10^{17}$ cm$^{-3}$, whereas the p-type AlGaInP upper cladding layer 14 is doped with Zn so that the carrier concentration becomes about $5 \times 10^{17}$ cm$^{-3}$. The n-type lower cladding layer 12, the active layer 13 and the p-type upper cladding layer 14 form a multilayer structure including a light emitting section of the LED 100.

Then, a p-type $Al_yIn_{1-y}As$ intermediate layer 15 (e.g., y=0.79, and a thickness of about 0.1 μm) is formed on the p-type AlGaInP upper cladding layer 14. The p-type AlInAs intermediate layer 15 is doped with Zn so that the carrier concentration becomes about $1 \times 10^{18}$ cm$^{-3}$.

Furthermore, a p-type GaP current diffusion layer 16 (e.g., a thickness of about 7 μm) is formed on the p-type AlInAs intermediate layer 15. The p-type GaP current diffusion layer 16 is doped with Zn so that the carrier concentration becomes about $2 \times 10^{18}$ cm$^{-3}$.

Then, for example, an Au—Zn film is deposited on the p-type GaP current diffusion layer 16 to be patterned in, for example, a circle to form a p-type electrode 17. On the other hand, for example, an Au—Ge film is deposited on the lower surface of the GaAs substrate 11 to form an n-type electrode 18, thus completing the LED 100.

FIG. 1B is a schematic view illustrating an energy band profile from the p-type AlGaInP upper cladding layer 14 to the p-type GaP current diffusion layer 16 in the LED 100 of the present embodiment obtained by the above-mentioned manner.

Figure 14A:
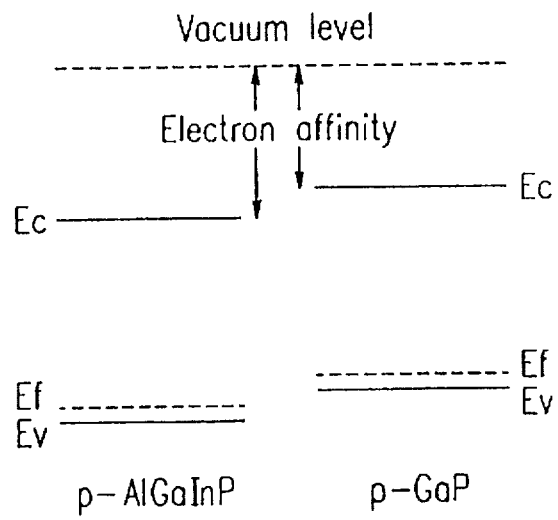
FIGS. 14A to 14C are schematic views illustrating energy band profiles before and after the junction formation of semiconductor materials and the behavior of carriers in the conventional semiconductor light emitting device.
Figure 14B:
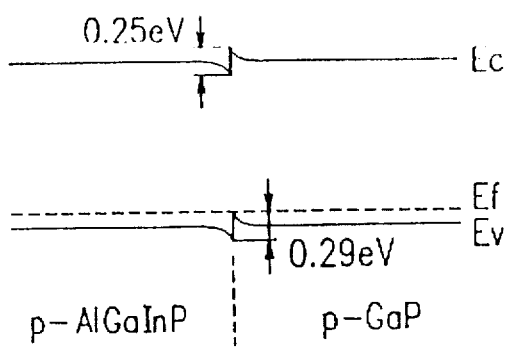
Figure 14C:
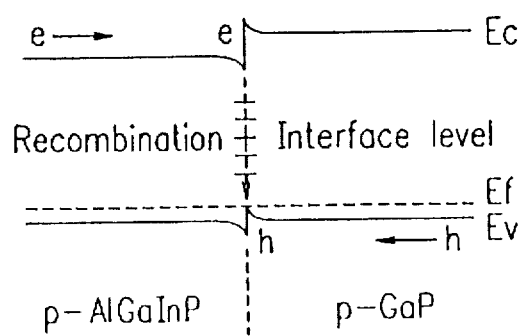

As previously described with reference to FIG. 14B, in the conventional LED including no intermediate layer between the p-type AlGaInP upper cladding layer and the p-type GaP current diffusion layer, notches are generated at the interface between the p-type AlGaInP upper cladding layer and the p-type GaP current diffusion layer. In particular, a notch of an energy difference of 0.25 eV is generated at the lower end of the conduction band, and a notch of an energy difference of 0.29 eV is generated at the upper end of the valence band. On the other hand, in the LED 100 formed according to the present embodiment, the p-type AlInAs intermediate layer 15 is inserted between the p-type AlGaInP upper cladding layer 14 and the p-type GaP current diffusion layer 16 so that notches are generated in a distributed manner into a plurality of junction interfaces. As a result, the energy difference of the notch generated at the lower end of the conduction band is about 0.20 eV at maximum, and the energy difference of the notch generated at the upper end of the valence band is about 0.24 eV at maximum. Thus, the energy difference is lower than that in the conventional technique.

By such reduction in notches, in the LED 100 according to the present embodiment, an operating voltage is reduced to about 2.4 V at an operating current of 20 mA when compared with the operating voltage of about 2.5 V in the conventional technique. In addition, luminance is improved to about 1.1 times higher.

Second Embodiment

A light emitting diode (LED) 200 will be described with reference to FIGS. 2A and 2B as a semiconductor light emitting device in a second embodiment of the present invention. FIG. 2A is a cross sectional view illustrating the structure of the LED 200. FIG. 2B is a schematic view illustrating an energy band profile at the junction interface of the multilayer structure from an upper cladding layer to a current diffusion layer in the LED 200.

As shown in FIG. 2A, in the LED 200, an n-type $(Al_xGa_{1-x})_{0.51}In_{0.49}P$ ($0 \leq X \leq 1$) lower cladding layer 22 (e.g., x=1.0 and a thickness of about 1.0 μm), $(Al_xGa_{1-x})_{0.51}In_{0.49}P$ ($0 \leq X \leq 1$) active layer 23 (e.g., x=0.3 and a thickness of about 0.5 μm) and a p-type $(Al_xGa_{1-x})_{0.51}In_{0.49}P$ ($0 \leq X \leq 1$) upper cladding layer 24 (e.g., x=1.0 and a thickness of about 1.0 μm) are sequentially formed on an n-type GaAs substrate 21 in this order. The n-type AlGaInP lower cladding layer 22 is doped with Si so that the carrier concentration becomes about $5 \times 10^{17}$ cm$^{-3}$, whereas the p-type AlGaInP upper cladding layer 24 is doped with Zn so that the carrier concentration becomes about $5 \times 10^{17}$ cm$^{-3}$. The n-type lower cladding layer 22, the active layer 23 and the p-type upper cladding layer 24 form a multilayer structure including a light emitting section of the LED 200.

Then, a first p-type $Al_yIn_{1-y}As$ intermediate layer 25 (e.g., y=0.88, and a thickness of about 0.1 μm) and a second p-type $Al_yIn_{1-y}As$ intermediate layer 26 (e.g., y=0.72, and a thickness of about 0.1 μm) are formed on the p-type AlGaInP upper cladding layer 24. The first and second p-type AlInAs intermediate layers 25 and 26 are doped with Zn so that the carrier concentration becomes about $1 \times 10^{18}$ cm$^{-3}$.

Furthermore, a p-type GaP current diffusion layer 27 (e.g., a thickness of about 7 μm) is formed on the second p-type AlInAs intermediate layer 26. The p-type GaP current diffusion layer 27 is doped with Zn so that the carrier concentration becomes about $2 \times 10^{18}$ cm$^{-3}$.

Then, for example, an Au—Zn film is deposited on the p-type GaP current diffusion layer 27 to be patterned in, for example, a circle to form a p-type electrode 28. On the other hand, for example, an Au—Ge film is deposited on the lower surface of the GaAs substrate 21 to form an n-type electrode 29, thus completing the LED 200.

FIG. 2B is a schematic view illustrating an energy band profile from the p-type AlGaInP upper cladding layer 24 to the p-type GaP current diffusion layer 27 in the LED 200 of the present embodiment obtained by the above-mentioned manner.

As previously described with reference to FIG. 14B, in the conventional LED including no intermediate layer between the p-type AlGaInP upper cladding layer and the p-type GaP current diffusion layer, notches are generated at the interface between the p-type AlGaInP upper cladding layer and the p-type GaP current diffusion layer. In particular, a notch of an energy difference of 0.25 eV is generated at the lower end of the conduction band, and a notch of an energy difference of 0.29 eV is generated at the upper end of the valence band. On the other hand, in the LED 200 formed according to the present embodiment, the first and second p-type AlInAs intermediate layers 25 and 26 are inserted between the p-type AlGaInP upper cladding layer 24 and the p-type GaP current diffusion layer 27 so that notches are generated in a distributed manner into a plurality of junction interfaces. As a result, the energy difference of the notch generated at the lower end of the conduction band is about 0.15 eV at maximum, and the energy difference of the notch generated at the upper end of the valence band is about 0.18 eV at maximum. Thus, the energy difference is lower than that in the conventional technique.

By such reduction in notches, in the LED 200 according to the present embodiment, an operating voltage is reduced to about 2.3 V at an operating current of 20 mA when compared with the operating voltage of about 2.5 V in the conventional technique. In addition, luminance is improved to about 1.2 times higher.

Third Embodiment

Figure 3:
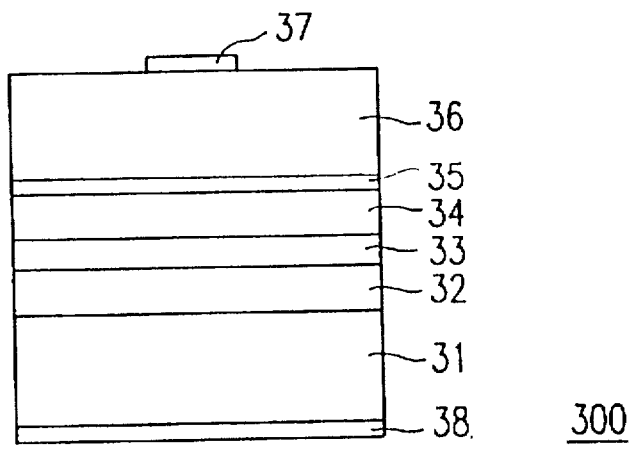
FIG. 3 is a cross sectional view illustrating a structure of a semiconductor light emitting device in a third embodiment of the present invention.

A light emitting diode (LED) 300 will be described with reference to FIG. 3 as a semiconductor light emitting device in a third embodiment of the present invention. FIG. 3 is a cross sectional view illustrating the structure of the LED 300.

As shown in FIG. 3, in the LED 300, an n-type $(Al_xGa_{1-x})_{0.51}In_{0.49}P$ ($0 \leq X \leq 1$) lower cladding layer 32 (e.g., x=1.0 and a thickness of about 1.0 μm), $(Al_xGa_{1-x})_{0.51}In_{0.49}P$ ($0 \leq X \leq 1$) active layer 33 (e.g., x=0.3 and a thickness of about 0.5 μm) and a p-type $(Al_xGa_{1-x})_{0.51}In_{0.49}P$ ($0 \leq X \leq 1$) upper cladding layer 34 (e.g., x=1.0 and a thickness of about 1.0 μm) are sequentially formed on an n-type GaAs substrate 31 in this order. The n-type AlGaInP lower cladding layer 32 is doped with Si so that the carrier concentration becomes about $5 \times 10^{17}$ cm$^{-3}$, whereas the p-type AlGaInP upper cladding layer 34 is doped with Zn so that the carrier concentration becomes about $5 \times 10^{17}$ cm$^{-3}$. The n-type lower cladding layer 32, the active layer 33 and the p-type upper cladding layer 34 form a multilayer structure including a light emitting section of the LED 300.

Then, a p-type $GaAs_zP_{1-z}$ intermediate layer 35 (e.g., z=0.5, and a thickness of about 0.1 μm) is formed on the p-type AlGaInP upper cladding layer 34. The p-type GaAsP intermediate layer 35 is doped with Zn so that the carrier concentration becomes about $1 \times 10^{18}$ cm$^{-3}$.

Furthermore, a p-type GaP current diffusion layer 36 (e.g., a thickness of about 7 μm) is formed on the p-type GaAsP intermediate layer 35. The p-type GaP current diffusion layer 36 is doped with Zn so that the carrier concentration becomes about $2 \times 10^{18}$ cm$^{-3}$.

Then, for example, an Au—Zn film is deposited on the p-type GaP current diffusion layer 36 to be patterned in, for example, a circle to form a p-type electrode 37. On the other hand, for example, an Au—Ge film is deposited on the lower surface of the GaAs substrate 31 to form an n-type electrode 38, thus completing the LED 300.

In the LED 300 of the present embodiment constructed in the aforementioned manner, the lattice constants of the p-type AlGaInP upper cladding layer 34, the p-type $GaAs_zP_{1-z}$ intermediate layer 35 and the p-type GaP current diffusion layer 36 are 5.65 Å, 5.55 Å and 5.45 Å, respectively. Thus, the p-type $GaAs_zP_{1-z}$ intermediate layer 35 alleviates the lattice mismatching between the p-type AlGaInP upper cladding layer 34 and the p-type GaP current diffusion layer 36. Such alleviation of lattice mismatching by the intermediate layer 35 improves the luminance of the LED 300 of the present embodiment to about 1.2 times higher than that of the conventional LED.

Fourth Embodiment

Figure 4:
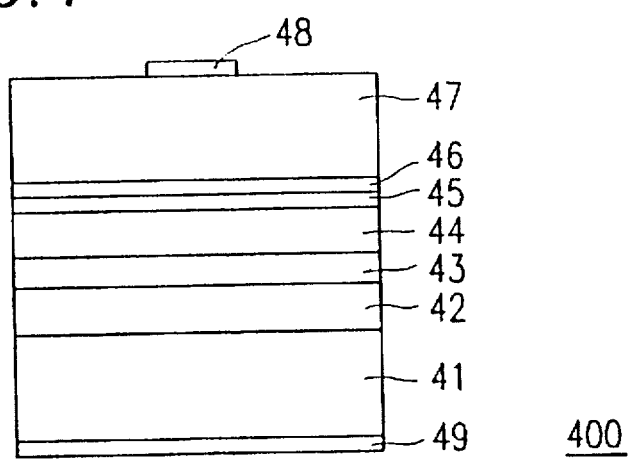
FIG. 4 is a cross sectional view illustrating a structure of a semiconductor light emitting device in a fourth embodiment of the present invention.

A light emitting diode (LED) 400 will be described with reference to FIG. 4 as a semiconductor light emitting device in a fourth embodiment of the present invention. FIG. 4 is a cross sectional view illustrating the structure of the LED 400.

As shown in FIG. 4, in the LED 400, an n-type $(Al_xGa_{1-x})_{0.51}In_{0.49}P$ ($0 \leq X \leq 1$) lower cladding layer 42 (e.g., x=1.0 and a thickness of about 1.0 μm), $(Al_xGa_{1-x})_{0.5}In_{0.49}P$ ($0 \leq X \leq 1$) active layer 43 (e.g., x=0.3 and a thickness of about 0.5 μm) and a p-type $(Al_xGa_{1-x})_{0.51}In_{0.49}P$ ($0 \leq X \leq 1$) upper cladding layer 44 (e.g., x=1.0 and a thickness of about 1.0 μm) are sequentially formed on an n-type GaAs substrate 41 in this order. The n-type AlGaInP lower cladding layer 42 is doped with Si so that the carrier concentration becomes about $5 \times 10^{17}$ cm$^{-3}$, whereas the p-type AlGaInP upper cladding layer 44 is doped with Zn so that the carrier concentration becomes about $5 \times 10^{17}$ cm$^{-3}$. The n-type lower cladding layer 42, the active layer 43 and the p-type upper cladding layer 44 form a multilayer structure including a light emitting section of the LED 400.

Then, a first p-type $GaAs_zP_{1-z}$ intermediate layer 45 (e.g., z=0.6, and a thickness of about 0.1 μm) and a second p-type $GaAs_zP_{1-z}$ intermediate layer 46 (e.g., z=0.3, and a thickness of about 0.1 μm) are formed on the p-type AlGaInP upper cladding layer 44. The first and second p-type GaAsP intermediate layers 45 and 46 are doped with Zn so that the carrier concentration becomes about $1 \times 10^{18}$ cm$^{-3}$.

Furthermore, a p-type GaP current diffusion layer 47 (e.g., a thickness of about 7 μm) is formed on the second p-type GaAsP intermediate layer 46. The p-type GaP current diffusion layer 47 is doped with Zn so that the carrier concentration becomes about $2 \times 10^{18}$ cm$^{-3}$.

Then, for example, an Au—Zn film is deposited on the p-type GaP current diffusion layer 47 to be patterned in, for example, a circle to form a p-type electrode 48. On the other hand, for example, an Au—Ge film is deposited on the lower surface of the GaAs substrate 41 to form an n-type electrode 49, thus completing the LED 400.

In the LED 400 of the present embodiment constructed in the aforementioned manner, the lattice constants of the p-type AlGaInP upper cladding layer 44, the first p-type $GaAs_zP_{1-z}$ intermediate layer 45, the second p-type $GaAs_zP_{1-z}$ intermediate layer 46 and the p-type GaP current diffusion layer 47 are 5.65 Å, 5.57 Å, 5.51 Å and 5.45 Å, respectively. Thus, the first and second p-type $GaAs_zP_{1-z}$ intermediate layers 45 and 46 alleviate the lattice mismatching between the p-type AlGaInP upper cladding layer 44 and the p-type GaP current diffusion layer 47. Such alleviation of lattice mismatching by the first and second p-type GaAsP intermediate layers 45 and 46 improves the luminance of the LED 400 of the present embodiment to about 1.3 times higher than that of the conventional LED.

Fifth Embodiment

A light emitting diode (LED) 500 will be described with reference to FIGS. 5A and 5B as a semiconductor light emitting device in a fifth embodiment of the present invention. FIG. 5A is a cross sectional view illustrating the structure of the LED 500. FIG. 5B is a schematic view illustrating an energy band profile at the junction interface of the multilayer structure from an upper cladding layer to a current diffusion layer in the LED 500.

As shown in FIG. 5A, in the LED 500, an n-type $(Al_xGa_{1-x})_{0.51}In_{0.49}P$ ($0 \leq X \leq 1$) lower cladding layer 52 (e.g., x=1.0 and a thickness of about 1.0 μm), $(Al_xGa_{1-x})_{0.51}In_{0.49}P$ ($0 \leq X \leq 1$) active layer 53 (e.g., x=0.3 and a thickness of about 0.5 μm) and a p-type $(Al_xGa_{1-x})_{0.51}In_{0.49}P$ ($0 \leq X \leq 1$) upper cladding layer 54 (e.g., x=1.0 and a thickness of about 1.0 μm) are sequentially formed on an n-type GaAs substrate 51 in this order. The n-type AlGaInP lower cladding layer 52 is doped with Si so that the carrier concentration becomes about $5 \times 10^{17}$ cm$^{-3}$, whereas the p-type AlGaInP upper cladding layer 54 is doped with Zn so that the carrier concentration becomes about $5 \times 10^{17}$ cm$^{-3}$. The n-type lower cladding layer 52, the active layer 53 and the p-type upper cladding layer 54 form a multilayer structure including a light emitting section of the LED 500.

Then, a p-type $Ga_{1-u-v}In_uAl_vP$ intermediate layer 55 (e.g., u=v=0.25, and a thickness of about 0.1 μm) is formed on the p-type AlGaInP upper cladding layer 54. The p-type GaInAlP intermediate layer 55 is doped with Zn so that the carrier concentration becomes about $1 \times 10^{18}$ cm$^{-3}$.

Furthermore, a p-type GaP current diffusion layer 56 (e.g., a thickness of about 7 μm) is formed on the p-type GaInAlP intermediate layer 55. The p-type GaP current diffusion layer 56 is doped with Zn so that the carrier concentration becomes about $2 \times 10^{18}$ cm$^{-3}$.

Then, for example, an Au—Zn film is deposited on the p-type GaP current diffusion layer 56 to be patterned in, for example, a circle to form a p-type electrode 57. On the other hand, for example, an Au—Ge film is deposited on the lower surface of the GaAs substrate 51 to form an n-type electrode 58, thus completing the LED 500.

FIG. 5B is a schematic view illustrating an energy band profile from the p-type AlGaInP upper cladding layer 54 to the p-type GaP current diffusion layer 56 in the LED 500 of the present embodiment obtained by the above-mentioned manner.

As previously described with reference to FIG. 14B, in the conventional LED including no intermediate layer between the p-type AlGaInP upper cladding layer and the p-type GaP current diffusion layer, notches are generated at the interface between the p-type AlGaInP upper cladding layer and the p-type GaP current diffusion layer. In particular, a notch of an energy difference of 0.25 eV is generated at the lower end of the conduction band, and a notch of an energy difference of 0.29 eV is generated at the upper end of the valence band. On the other hand, in the LED 500 formed according to the present embodiment, the p-type GaInAlP intermediate layer 55 is inserted between the p-type AlGaInP upper cladding layer 54 and the p-type GaP current diffusion layer 56 so that notches are generated in a distributed manner into a plurality of junction interfaces. As a result, the energy difference of the notch generated at the lower end of the conduction band is about 0.13 eV at maximum, and the energy difference of the notch generated at the upper end of the valence band is about 0.16 eV at maximum. Thus, the energy difference is lower than that in the conventional technique.

Furthermore, in the LED 500 of the present embodiment, the lattice constants of the p-type AlGaInP upper cladding layer 54, the p-type GaInAlP intermediate layer 55 and the p-type GaP current diffusion layer 56 are 5.65 Å, 5.55 Å and 5.45 Å, respectively. Thus, the p-type GaInAlP intermediate layer 55 alleviates the lattice mismatching between the p-type AlGaInP upper cladding layer 54 and the p-type GaP current diffusion layer 56.

By such reduction in notches and alleviation of lattice mismatching by the intermediate layer 55, in the LED 500 according to the present embodiment, an operating voltage is reduced to about 2.1 V at an operating current of 20 mA when compared with the operating voltage of about 2.5 V in the conventional technique. In addition, luminance is improved to about 1.4 times higher.

Sixth Embodiment

Figure 6A:
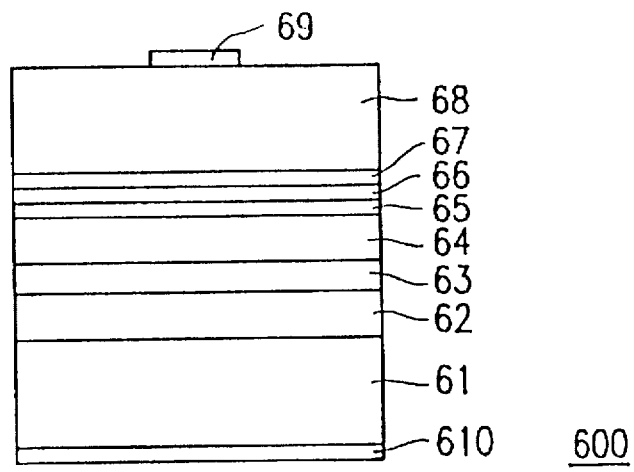
FIG. 6A is a cross sectional view illustrating a structure of a semiconductor light emitting device in a sixth embodiment of the present invention.
Figure 6B:
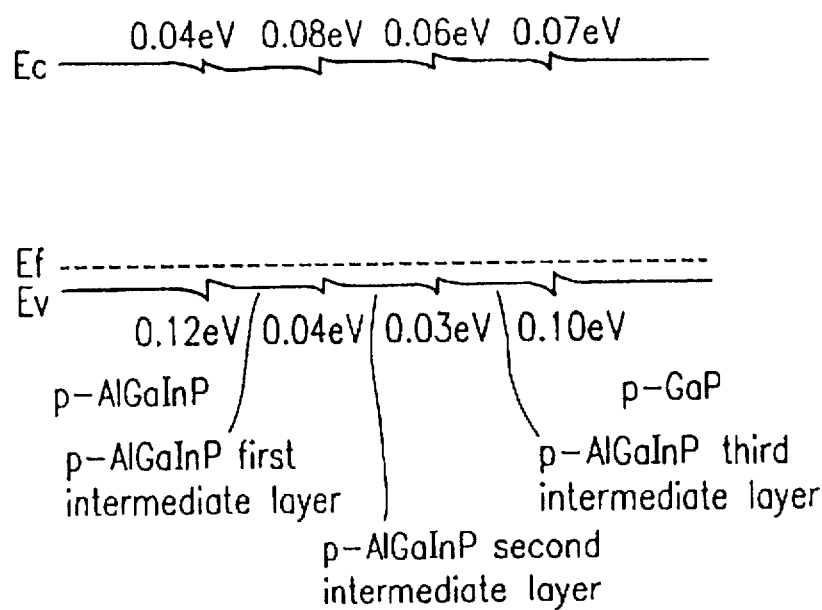
FIG. 6B is a schematic view illustrating an energy band profile from the upper cladding layer to the current diffusion layer of the semiconductor light emitting device in the sixth embodiment of the present invention.

A light emitting diode (LED) 600 will be described with reference to FIGS. 6A and 6B as a semiconductor light emitting device in a sixth embodiment of the present invention. FIG. 6A is a cross sectional view illustrating the structure of the LED 600. FIG. 6B is a schematic view illustrating an energy band profile at the junction interface of the multilayer structure from an upper cladding layer to a current diffusion layer in the LED 600.

As shown in FIG. 6A, in the LED 600, an n-type $(Al_xGa_{1-x})_{0.51}In_{0.49}P$ ($0 \leq X \leq 1$) lower cladding layer 62 (e.g., x=1.0 and a thickness of about 1.0 μm), $(Al_xGa_{1-x})_{0.51}In_{0.49}P$ ($0 \leq X \leq 1$) active layer 63 (e.g., x=0.3 and a thickness of about 0.5 μm) and a p-type $(Al_xGa_{1-x})_{0.51}In_{0.49}P$ ($0 \leq X \leq 1$) upper cladding layer 64 (e.g., x=1.0 and a thickness of about 1.0 μm) are sequentially formed on an n-type GaAs substrate 61 in this order. The n-type AlGaInP lower cladding layer 62 is doped with Si so that the carrier concentration becomes about $5 \times 10^{17}$ cm$^{-3}$, whereas the p-type AlGaInP upper cladding layer 64 is doped with Zn so that the carrier concentration becomes about $5 \times 10^{17}$ cm$^{-3}$. The n-type lower cladding layer 62, the active layer 63 and the p-type upper cladding layer 64 form a multilayer structure including a light emitting section of the LED 600.

Then, a first p-type $Ga_{1-u-v}In_uAl_vP$ intermediate layer 65 (e.g., u=0.15, v=0.20 and a thickness of about 0.1 μm) and a second p-type $Ga_{1-u-v}In_uAl_vP$ intermediate layer 66 (e.g., u=v=0 and a thickness of about 0.1 μm) and a third p-type $Ga_{1-u-v}In_uAl_vP$ intermediate layer 67 (e.g., u=0.35, v=0.30 and a thickness of about 0.1 μm) are sequentially formed on the p-type AlGaInP upper cladding layer 64 in this order. The first, second and third p-type GaInAlP intermediate layers 65, 66 and 67 are doped with Zn so that the carrier concentration becomes about $1 \times 10^{18}$ cm$^{-3}$.

Furthermore, a p-type GaP current diffusion layer 68 (e.g., a thickness of about 7 μm) is formed on the third p-type GaInAlP intermediate layer 67. The p-type GaP current diffusion layer 68 is doped with Zn so that the carrier concentration becomes about $2 \times 10^{18}$ cm$^{-3}$.

Then, for example, an Au—Zn film is deposited on the p-type GaP current diffusion layer 68 to be patterned in, for example, a circle to form a p-type electrode 69. On the other hand, for example, an Au—Ge film is deposited on the lower surface of the GaAs substrate 61 to form an n-type electrode 610, thus completing the LED 600.

FIG. 6B is a schematic view illustrating an energy band profile from the p-type AlGaInP upper cladding layer 64 to the p-type GaP current diffusion layer 68 in the LED 600 of the present embodiment obtained by the above-mentioned manner.

As previously described with reference to FIG. 14B, in the conventional LED including no intermediate layer between the p-type AlGaInP upper cladding layer and the p-type GaP current diffusion layer, notches are generated at the interface between the p-type AlGaInP upper cladding layer and the p-type GaP current diffusion layer. In particular, a notch of an energy difference of 0.25 eV is generated at the lower end of the conduction band, and a notch of an energy difference of 0.29 eV is generated at the upper end of the valence band. On the other hand, in the LED 600 formed according to the present embodiment, the first, second and third p-type GaInAlP intermediate layers 65, 66 and 67 are inserted between the p-type AlGaInP upper cladding layer 64 and the p-type GaP current diffusion layer 68 so that notches are generated in a distributed manner into a plurality of junction interfaces. As a result, the energy difference of the notch generated at the lower end of the conduction band is about 0.08 eV at maximum, and the energy difference of the notch generated at the upper end of the valence band is about 0.12 eV at maximum. Thus, the energy difference is lower than that in the conventional technique.

Furthermore, in the LED 600 of the present embodiment, the lattice constants of the p-type AlGaInP upper cladding layer 64, the first p-type GaInAlP intermediate layer 65, the second p-type GaInAlP intermediate layer 66, the third p-type GaInAlP intermediate layer 67 and the p-type GaP current diffusion layer 68 are 5.65 Å, 5.60 Å, 5.55 Å, 5.51 Å and 5.45 Å, respectively. Thus, the first, second and third p-type GaInAlP intermediate layers 65, 66 and 67 alleviate the lattice mismatching between the p-type AlGaInP upper cladding layer 64 and the p-type GaP current diffusion layer 68.

By such reduction in notches and alleviation of lattice mismatching by the first, second and third intermediate layers 65, 66 and 67 in the LED 600 according to the present embodiment, an operating voltage is reduced to about 2.0 V at an operating current of 20 mA when compared with the operating voltage of about 2.5 V in the conventional technique. In addition, luminance is improved to about 1.5 times higher.

Seventh Embodiment

Figure 7A:
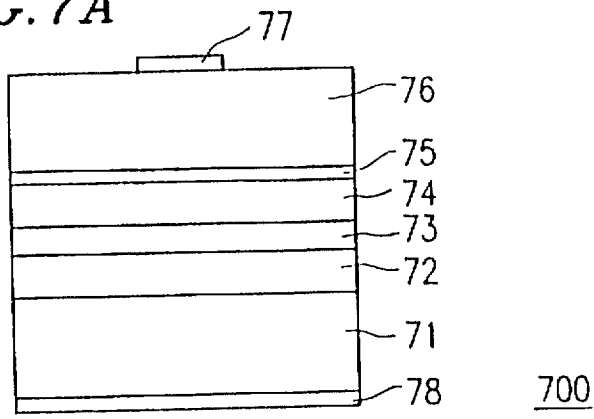
FIG. 7A is a cross sectional view illustrating a structure of a semiconductor light emitting device in a seventh embodiment of the present invention.
Figure 7B:
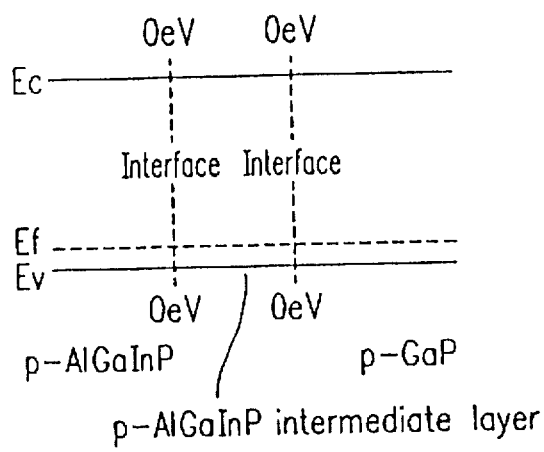
FIG. 7B is a schematic view illustrating an energy band profile from the upper cladding layer to the current diffusion layer of the semiconductor light emitting device in the seventh embodiment of the present invention.
Figure 7C:
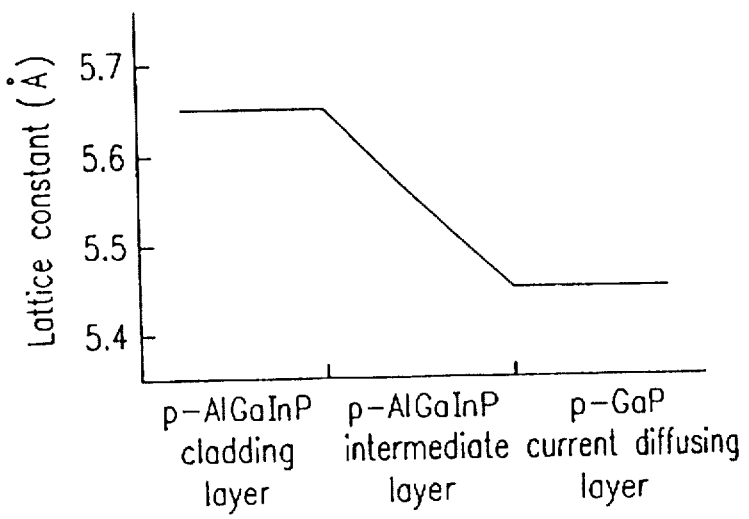
FIG. 7C is a schematic view illustrating a change of a lattice constant from the upper cladding layer to the current diffusion layer.

A light emitting diode (LED) 700 will be described with reference to FIGS. 7A to 7C as a semiconductor light emitting device in a seventh embodiment of the present invention. FIG. 7A is a cross sectional view illustrating the structure of the LED 700. FIG. 7B is a schematic view illustrating an energy band profile at the junction interface of the multilayer structure from an upper cladding layer to a current diffusion layer in the LED 700. FIG. 7C is a graph schematically showing a change of the lattice constant in the multilayer structure from the upper cladding layer to the current diffusion layer in the LED 700.

As shown in FIG. 7A, in the LED 700, an n-type $(Al_xGa_{1-x})_{0.51}In_{0.49}P$ ($0 \leq X \leq 1$) lower cladding layer 72 (e.g., x=1.0 and a thickness of about 1.0 μm), $(Al_xGa_{1-x})_{0.51}In_{0.49}P$ ($0 \leq X \leq 1$) active layer 73 (e.g., x=0.3 and a thickness of about 0.5 μm) and a p-type $(Al_xGa_{1-x})_{0.51}In_{0.49}P$ ($0 \leq X \leq 1$) upper cladding layer 74 (e.g., x=1.0 and a thickness of about 1.0 μm) are sequentially formed on an n-type GaAs substrate 71 in this order. The n-type AlGaInP lower cladding layer 72 is doped with Si so that the carrier concentration becomes about $5 \times 10^{17}$ cm$^{-3}$, whereas the p-type AlGaInP upper cladding layer 74 is doped with Zn so that the carrier concentration becomes about $5 \times 10^{17}$ cm$^{-3}$. The n-type lower cladding layer 72, the active layer 73 and the p-type upper cladding layer 74 form a multilayer structure including a light emitting section of the LED 700.

Then, a p-type $(Al_uGa_{1-u})_{1-v}In_vP$ intermediate layer 75 (e.g., a thickness of about 0.1 μm) is formed on the p-type AlGaInP upper cladding layer 74. The composition of the p-type AlGaInP intermediate layer 75 can be sequentially changed from $Al_{0.51}In_{0.49}P$ to GaP by sequentially changing u in the composition formula from 1 to 0, or v from 0.49 to 0. Furthermore, the p-type AlGaInP intermediate layer 75 is doped with Zn so that the carrier concentration becomes about $1 \times 10^{18}$ cm$^{-3}$.

Furthermore, a p-type Gap current diffusion layer 76 (e.g., a thickness of about 7 μm) is formed on the p-type AlGaInP intermediate layer 75. The p-type GaP current diffusion layer 76 is doped with Zn so that the carrier concentration becomes about $2 \times 10^{18}$ cm$^{-3}$.

Then, for example, an Au—Zn film is deposited on the p-type GaP current diffusion layer 76 to be patterned in, for example, a circle to form a p-type electrode 77. On the other hand, for example, an Au—Ge film is deposited on the lower surface of the GaAs substrate 71 to form an n-type electrode 78, thus completing the LED 700.

FIG. 7B is a schematic view illustrating an energy band profile from the p-type AlGaInP upper cladding layer 74 to the p-type GaP current diffusion layer 76 in the LED 700 of the present embodiment obtained by the above-mentioned manner.

As previously described with reference to FIG. 14B, in the conventional LED including no intermediate layer between the p-type AlGaInP upper cladding layer and the p-type GaP current diffusion layer, notches are generated at the interface between the p-type AlGaInP upper cladding layer and the p-type GaP current diffusion layer. In particular, a notch of an energy difference of 0.25 eV is generated at the lower end of the conduction band, and a notch of an energy difference of 0.29 eV is generated at the upper end of the valence band. On the other hand, in the LED 700 formed according to the present embodiment, the p-type AlGaInP intermediate layer 75 sequentially changing its composition is inserted between the p-type AlGaInP upper cladding layer 74 and the p-type GaP current diffusion layer 76 so that notches are completely eliminated.

Furthermore, as the composition of the p-type AlGaInP intermediate layer 75 is sequentially changed, as shown in FIG. 7C, the lattice constant from the p-type AlGaInP upper cladding layer 74 to the p-type GaP current diffusion layer 76 is sequentially changed. As a result, the lattice mismatching between the p-type AlGaInP upper cladding layer 74 and the p-type GaP current diffusion layer 76 is alleviated.

By such reduction in notches and alleviation of lattice mismatching, in the LED 700 according to the present embodiment, operating voltage is reduced to about 2.0 V at an operating current of 20 mA when compared with the operating voltage of about 2.5 V in the conventional technique. In addition, luminance is improved to about 1.4 times higher.

Eighth Embodiment

Figure 8A:
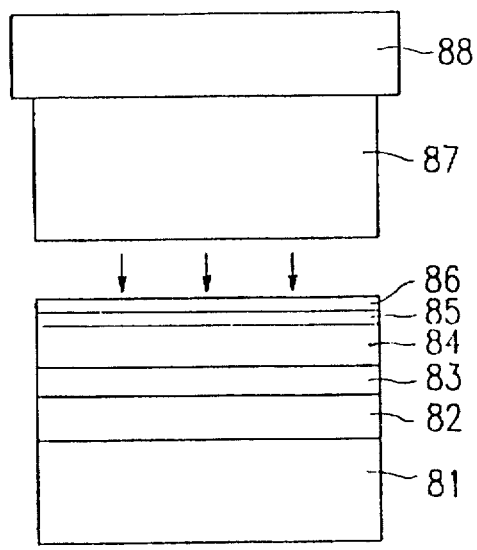
FIGS. 8A to 8C are cross sectional views illustrating a structure and a production method of a semiconductor light emitting device in an eighth embodiment of the present invention.
Figure 8B:
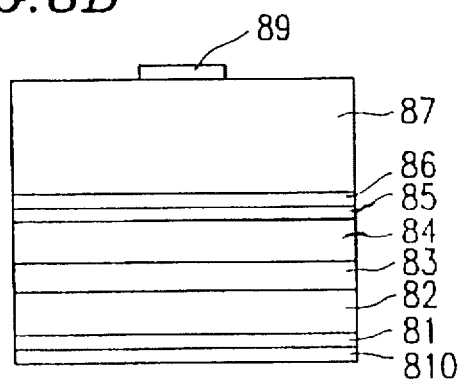
Figure 8C:
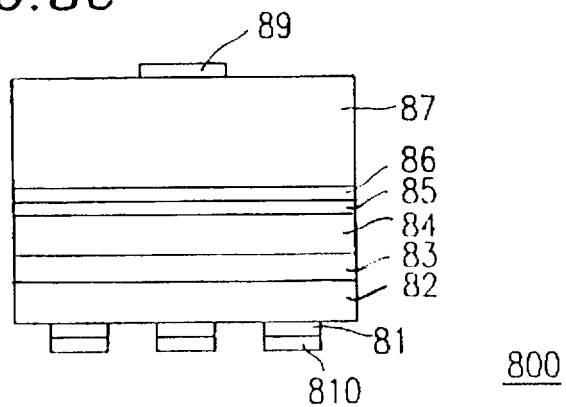

A light emitting diode (LED) 800 will be described with reference to FIGS. 8A to 8C as a semiconductor light emitting device in an eighth embodiment of the present invention. FIGS. 8A to 8C are cross sectional views illustrating the structure of the LED 800 and the production process thereof.

In producing the LED 800, as shown in FIG. 8A, an n-type $(Al_xGa_{1-x})_{0.51}In_{0.49}P$ ($0 \leq X \leq 1$) lower cladding layer 82 (e.g., x=1.0 and a thickness of about 1.0 μm), $(Al_xGa_{1-x})_{0.51}In_{0.49}P$ ($0 \leq X \leq 1$) active layer 83 (e.g., x=0.3 and a thickness of about 0.5 μm) and a p-type $(Al_xGa_{1-x})_{0.51}In_{0.49}P$ ($0 \leq X \leq 1$) upper cladding layer 84 (e.g., x=1.0 and a thickness of about 1.0 μm) are sequentially formed on an n-type GaAs substrate 81 in this order. The n-type AlGaInP lower cladding layer 82 is doped with Si so that the carrier concentration becomes about $5 \times 10^{17}$ cm$^{-3}$, whereas the p-type AlGaInP upper cladding layer 84 is doped with Zn so that the carrier concentration becomes about $5 \times 10^{17}$ cm$^{-3}$. The n-type lower cladding layer 82, the active layer 83 and the p-type upper cladding layer 84 form a multilayer structure including a light emitting section of the LED 800.

Then, a p-type $Ga_{1-u-v}In_uAl_vP$ intermediate layer 85 (e.g., u=v=0.25, and a thickness of about 0.1 μm) is formed on the p-type AlGaInP upper cladding layer 84. The p-type GaInAlP intermediate layer 85 is doped with Zn so that the carrier concentration becomes about $1 \times 10^{18}$ cm$^{-3}$.

A p-type GaP cap layer 86 is grown on the p-type GaInAlP intermediate layer 85. Then, a p-type GaP substrate 87 is disposed on the GaP cap layer 86 so that the crystal axis of the GaP cap layer 86 is matched with that of the p-type GaP substrate 87. Furthermore, a weight 88 having a suitable weight is placed on the p-type GaP substrate 87, and a thermal treatment is performed at about 650° C. in a H$_2$ atmosphere so that the GaP cap layer 86 adheres to the p-type GaP substrate 87. After the junction formation, the p-type GaP substrate 87 functions as a current diffusion layer 87 of the LED 800.

Thereafter, as shown in FIG. 8B, a p-type electrode 89 is formed on the p-type GaP current diffusion layer 87 by a film deposition process and etching. The p-type electrode 89 is processed, for example, in a circle. Then, the n-type GaAs substrate 81 is etched to a thickness of about 10 μm to form an n-type electrode 810 across the entire lower surface of the n-type GaAs substrate 81 (see FIG. 8B).

Thereafter, as shown in FIG. 8C, the n-type electrode 810 and the GaAs substrate 81 are etched in suitable shapes by photolithography, thus obtaining the LED 800.

In the LED 800 of the present embodiment formed in aforementioned manner, it is possible to reduce notches present in the energy band profile, and alleviate lattice mismatching in the multilayer structure as in the LED 500 of the fifth embodiment. By such effects, in the LED 800 according to the present embodiment, an operating voltage is reduced to about 2.1 V at an operating current of 20 mA when compared with the operating voltage of about 2.5 V in the conventional technique. In addition, luminance is improved to about 1.2 times higher.

Ninth Embodiment

Figure 9A:
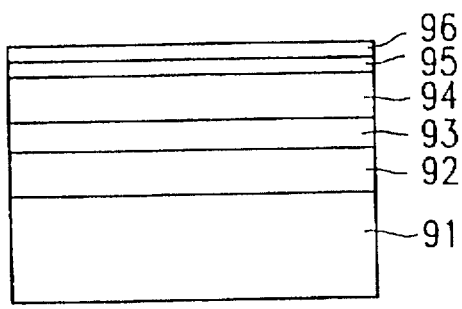
FIGS. 9A to 9C are cross sectional views illustrating a structure and a production method of a semiconductor light emitting device in a ninth embodiment of the present invention.
Figure 9B:
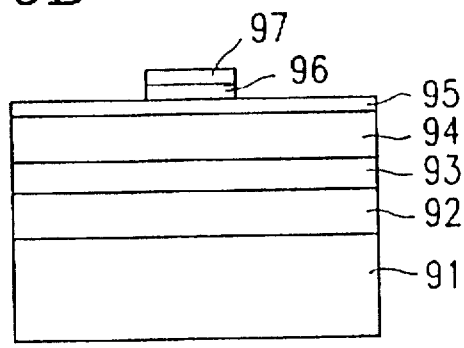
Figure 9C:
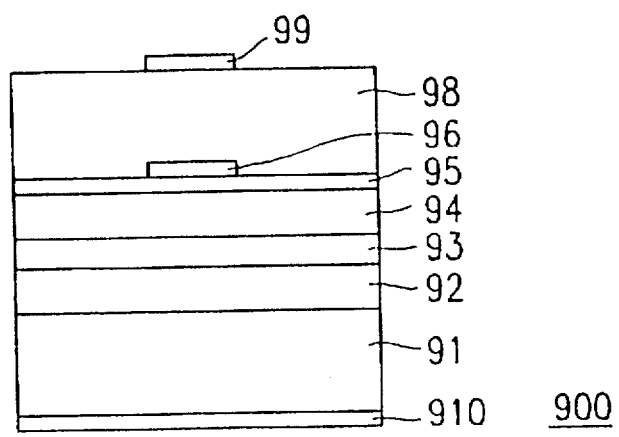

A light emitting diode (LED) 900 will be described with reference to FIGS. 9A to 9C as a semiconductor light emitting device in a ninth embodiment of the present invention. FIGS. 9A to 9C are cross sectional views illustrating the structure of the LED 900 and the production process thereof.

In producing the LED 900, as shown in FIG. 9A, an n-type $(Al_xGa_{1-x})_{0.51}In_{0.49}P$ ($0 \leq X \leq 1$) lower cladding layer 92 (e.g., x=1.0 and a thickness of about 1.0 μm), $(Al_xGa_{1-x})_{0.51}In_{0.49}P$ ($0 \leq X \leq 1$) active layer 93 (e.g., x=0.3 and a thickness of about 0.5 μm) and a p-type $(Al_xGa_{1-x})_{0.51}In_{0.49}P$ ($0 \leq X \leq 1$) upper cladding layer 94 (e.g., x=1.0 and a thickness of about 1.0 μm) are sequentially formed on an n-type GaAs substrate 91 in this order. The n-type AlGaInP lower cladding layer 92 is doped with Si so that the carrier concentration becomes about $5 \times 10^{17}$ cm$^{-3}$, whereas the p-type AlGaInP upper cladding layer 94 is doped with Zn so that the carrier concentration becomes about $5 \times 10^{17}$ cm$^{-3}$. The n-type lower cladding layer 92, the active layer 93 and the p-type upper cladding layer 94 form a multilayer structure including a light emitting section of the LED 900.

Then, a p-type $Ga_{1-u-v}In_uAl_vP$ intermediate layer 95 (e.g., u=v=0.25, and a thickness of about 0.1 μm) is formed on the p-type AlGaInP upper cladding layer 94. The p-type GaInAlP intermediate layer 95 is doped with Zn so that the carrier concentration becomes about $1 \times 10^{18}$ cm$^{-3}$.

An n-type GaP current blocking layer 96 (e.g., a thickness of about 0.3 μm) is grown on the p-type GaInAlP intermediate layer 95. Then, a suitably patterned resist 97 is applied onto the n-type GaP current blocking layer 96, and the n-type current blocking layer 96 is processed, for example, in a circle by etching (see FIG. 9B).

The resist 97 is removed after completing the etching, and then a p-type GaP current diffusion layer 98 (e.g., a thickness of about 7 μm) is formed on the n-type current blocking layer 96. The p-type GaP current diffusion layer 98 is doped with Zn so that the carrier concentration becomes about $2 \times 10^{18}$ cm$^{-3}$.

Then, for example, an Au—Zn film is deposited on the p-type GaP current diffusion layer 98 to be patterned in, for example, a circle to form a p-type electrode 99. On the other hand, for example, an Au—Ge film is deposited on the lower surface of the GaAs substrate 91 to form an n-type electrode 910, thus completing the LED 900.

In the LED 900 of the present embodiment having such a structure, current introduced from the p-type electrode 99 spreads in the p-type GaP current diffusion layer 98 over a region wider than the width of the n-type GaP current blocking layer 96, and then the current is introduced to the p-type AlGaInP upper cladding layer 94. With such a structure, light is generated in the portions except the portion immediately below the p-type electrode 99. As a result, the amount of light blocked by the p-type electrode 99 is reduced and light is emitted in a larger amount. Thus, light can come out more efficiently.

In the LED 900 of the present embodiment formed in aforementioned manner, it is possible to reduce notches present in the energy band profile, and alleviate lattice mismatching in the multilayer structure as in the case of the LED 500 of the fifth embodiment. By such effects, in the LED 900 according to the present embodiment, an operating voltage is reduced to about 2.1 V at an operating current of 20 mA when compared with the operating voltage of about 2.5 V in the conventional technique. In addition, luminance is improved to about 2 times higher.

In the aforementioned embodiments, when an intermediate layer is provided to alleviate notches in the energy band profile, the notches both at the lower end of the conduction band and the upper end of the valence band are attempted to be alleviated. However, it is not necessary to alleviate notches at both ends. Alternatively, by alleviating notches either at the lower end of the conduction band or the upper end of the valence band, the same effects as described above can be obtained.

In the aforementioned embodiments, materials for the upper cladding layer, the intermediate layer and the current diffusion layer are specifically mentioned. However, the present invention is not limited to any specific materials. For example, GaP is used as a material for the current diffusion layer, but AlGaP can be used instead of GaP. In this sense, the current diffusion layer in the aforementioned embodiments can be formed of an AlGaP type compound semiconductor material including both GaP and AlGaP.

No matter what material is used to form the current diffusion layer or the upper cladding layer, any material can be used for the intermediate layer, as long as the above-described relationship of the energy position at the lower end of the conduction band and/or the upper end of the valence band of the upper cladding layer; the intermediate layer and the current diffusion layer; or/and the above-described relationship of lattice constants; are satisfied. The selection of the material for the intermediate layer will be described below with reference to FIG. 10.

Figure 10:
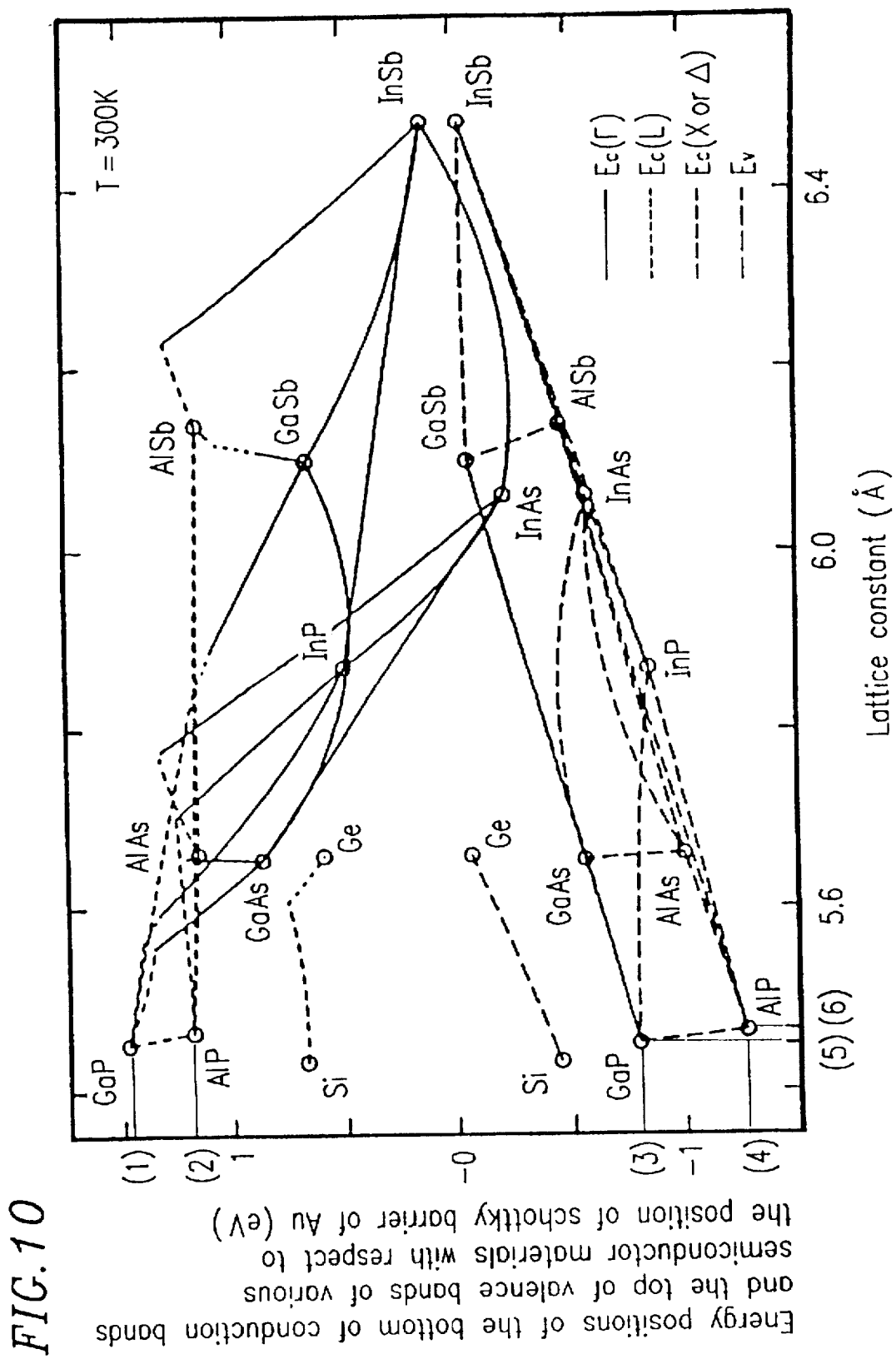
FIG. 10 is a graph schematically showing the relationship between the energy positions at the lower end of the conduction band and the upper end of the valence band and lattice constants in various compound semiconductor materials.
Figure 11:
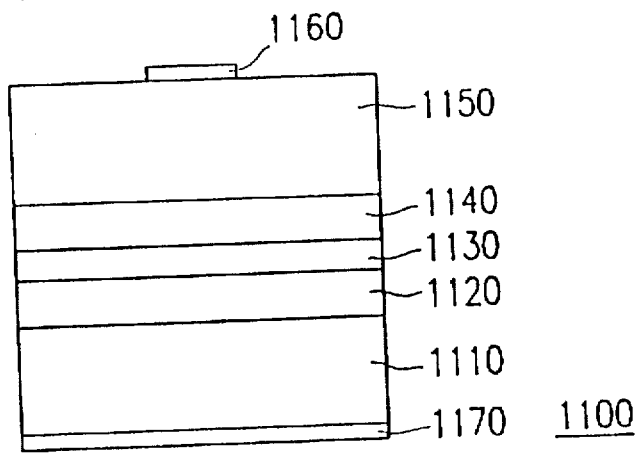
FIG. 11 is a cross sectional view illustrating a structure of a conventional semiconductor light emitting device.
Figure 12A:
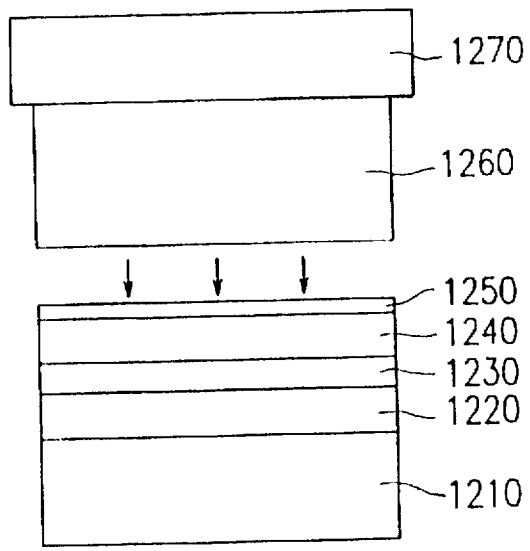
FIGS. 12A to 12C are cross sectional views illustrating a structure of another conventional semiconductor light emitting device and a production method thereof.
Figure 12B:
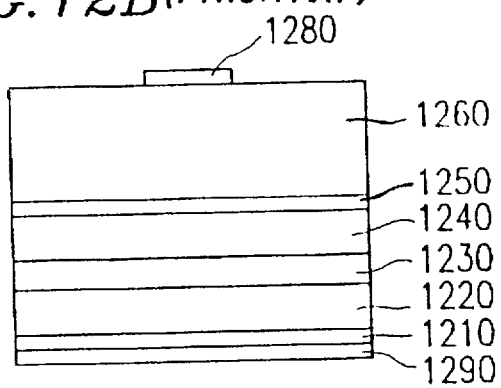
Figure 12C:
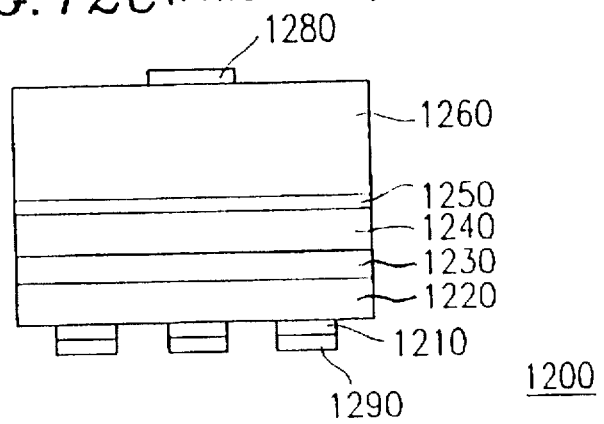

FIG. 10 is a graph showing the energy position at the lower end of the conduction band and the upper end of the valence band (ordinate) and lattice constants (abscissa) with respect to various semiconductor materials. The graph is described in Appl. Phys. Lett. Vol.60, No.5, pp.630–632 (1992). The energy position in the ordinate is plotted as a relative value with respect to the Schottky barrier position of Au. More specifically, circles in FIG. 10 indicate binary mixed crystals (except Si and Ge). Solid lines and broken lines connecting the circles indicate changes of values for ternary mixed crystals.

Herein, the junction between an AlP layer and a GaP layer is taken as an example to describe a method for determining a material for an intermediate layer to be inserted therebetween. AlP is not included in the material type specifically mentioned in the embodiments described above, but selected as an example herein, because AlP makes the following explanation easy with the plotted positional relationship in FIG. 10.

First, an example of selecting a material for the intermediate layer based on the energy band profile will be described.

The energy positions of the GaP layer and the AlP layer at the lower end of the conduction band are indicated by points (1) and (2) in the ordinate of FIG. 10, respectively. The energy positions of the GaP layer and the AlP layer at the upper end of the valence band are indicated by points (3) and (4) in the ordinate of FIG. 10, respectively. Therefore, a material for the intermediate layer is selected such that the energy position thereof at the lower end of the conduction band is present between the points (1) and (2), and/or the energy position thereof at the upper end of the valence band is present between the points (3) and (4).

On the other hand, in the case where the material is selected based on the lattice constant, values of the lattice constants of the GaP layer and the AlP layer are indicated by points (5) and (6) in the abscissa of FIG. 10. Thus, a material for the intermediate layer is selected such that the value of the lattice constant thereof is present between the points (5) and (6).

In the case where the material is selected based on both of the lattice constant and the energy band profile, the material which satisfies both of the conditions described above is selected.

By doing this, a suitable material for the intermediate layer can be determined. By replacing GaP and AlP in the above explanation by semiconductor materials actually used for forming the upper cladding layer and the current diffusion layer, the aforementioned method can be applied to any combination of materials. Even in the case where the semiconductor material layers to be used for forming the junction is constituted by quaternary mixed crystals, a suitable material can be selected by the same method as described above. In order to specifically obtain a material for the intermediate layer, a method generally used in the semiconductor technique can be used such as control of the composition ratio in the ternary type compound semiconductor material and the quaternary type compound semiconductor material.

In the aforementioned embodiments, the carrier concentration of the intermediate layer is about $1 \times 10^{18}$ cm$^{-3}$, but the intermediate layer is preferably formed such that the carrier concentration is in the range from about $1 \times 10^{17}$ cm$^{-3}$ to about $1 \times 10^{19}$ cm$^{-3}$. When the carrier concentration is smaller than the aforementioned range, the intermediate layer has a high resistance so that injection of carriers from the current diffusion layer to the upper cladding layer (active layer) is not sufficiently performed. On the other hand, when the carrier concentration is higher than the aforementioned range, degradation of crystallinity due to high concentration doping or due to diffusion of the doped impurities in solid may be caused.

Furthermore, the LEDs in the embodiments, the thickness of the intermediate layer is preferably in the range from about 0.01 μm to about 5 μm. When the thickness of the intermediate layer is smaller than the aforementioned range, a desired energy band profile cannot be obtained. When the thickness of the intermediate layer is larger than the aforementioned range, productivity is deteriorated.

Furthermore, crystal growth in each layer in the embodiments can be performed by a growth technique generally used in the semiconductor technique such as an MOCVD method, an MBE method, an MOMBE method and an LPE method.

Furthermore, doping of impurities such as Si and Zn to each layer can be performed by a method generally used in the semiconductor technique such as ion implantation as well as by supplying a material to be doped during the growth. Examples of impurities to be doped include impurities generally used in the semiconductor technique such as Se and Mg as well as Si or Zn.

As described above, discontinuities (notches) are generated in the energy band profile in the semiconductor light emitting device in the case where the energy positions at the lower end (the bottom) of the conduction band and the upper end (the top) of the valence band before the junction formation are different between semiconductor material layers to be used for forming the junction (more specifically, the upper cladding layer and the current diffusion layer). The height of the notch present at the lower end of the conduction band after the junction formation corresponds to the difference in the energy positions at the lower end of the conduction band of the two semiconductor material layers before the junction formation. Similarly, the height of the notch present at the upper end of the valence band after the junction formation corresponds to the difference in the energy positions at the upper end of the valence band of the two semiconductor material layers before the junction formation. Thus, the height of the notch is higher as the difference in the energy positions at the lower end of the conduction band and the upper end of the valence band in the upper cladding layer and the current diffusion layer before the junction formation is larger.

Thus, an intermediate layer is formed so that the energy position at the lower end of the conduction band thereof before the junction formation is positioned between the energy position at the lower end of the conduction band of the upper cladding layer before the junction formation and the energy position at the lower end of the conduction band of the current diffusion layer before the junction formation. Alternatively or additionally, the energy position at the upper end of the valence band of the intermediate layer before the junction formation is positioned between the energy position at the upper end of the valence band of the upper cladding layer before the junction formation and the energy position at the upper end of the valence band of the current diffusion layer before the junction formation. Accordingly, notches are generated with distributed to the both faces of the intermediate layer, i.e., the interface between the intermediate layer and the upper cladding layer and the interface between the intermediate layer and the current diffusion layer. As a result, the height of the notches appearing at each interface is reduced.

Furthermore, when the height of the notch is reduced, the thickness of the notch becomes thinner. Thus, by the tunneling effect of electrons, the effect of the notches as the barrier is reduced.

When the height and width of the notches at the interface between the upper cladding layer and the current diffusion layer are reduced by thus distributing the notches, the accumulation of carriers due to the notches is reduced so that the recombination of carriers at the junction interface can be reduced. When recombination of carriers is reduced, the efficiency of carrier injection into the active layer is improved. As a result, the light emission efficiency is improved. Furthermore, the function of the notches as the barrier to the carriers is reduced so that an operating voltage is also reduced.

On the other hand, in the case where lattice mismatching between the upper cladding layer and the current diffusion layer is present, a material having a lattice constant of a value between the lattice constant of the upper cladding layer and that of the current diffusion layer is selected to form an intermediate layer. Thus, the lattice mismatching is alleviated. Accordingly, the amount of interface levels is reduced. Thus, recombination of carriers at the junction interface can be also reduced so that the efficiency of carrier implantation to the active layer is improved, resulting in an improved light emission efficiency.

Furthermore, by alleviating the lattice mismatching described above, in the case where the current diffusion layer is formed by crystal growth, the crystallinity of the current diffusion layer can be improved. When the crystallinity is improved, optical transmittance is improved because current diffusion is promoted. Thus, light is emitted and exit more efficiently.

When the intermediate layer is formed of a plurality of layers, notches can be formed with being distributed to a larger number of interfaces. Consequently, the advantages described above such as reduction in the recombination of carriers and improvement of light emission efficiency can be further enhanced.

Furthermore, when the intermediate layer is formed such that the composition thereof is sequentially changed from the composition of the upper cladding layer to the composition of the current diffusion layer, the generation of notches in the energy band profile and lattice mismatching can be completely eliminated. Thus, the effect such as reduction in the recombination of carriers and improvement of light emission efficiency can be further enhanced.

As described above, in the semiconductor light emitting device of the present invention, by providing a predetermined intermediate layer between the upper cladding layer and the current diffusion layer, the generation of discontinuities (notches) in the energy band profile at the interface therebetween is reduced. Furthermore, lattice mismatching between the upper cladding layer and the current diffusion layer can be alleviated. Thus, a barrier and an interface level with respect to the carrier transfer is reduced so that recombination of carriers is reduced at the interface. As a result, the operating voltage of the semiconductor light emitting device is reduced so that the power consumption thereof can be reduced. Furthermore, the efficiency of carrier injection to the active layer is improved so that the light emission efficiency is improved. Thus, the luminance of the semiconductor light emitting device is improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light emitting device comprising:

a compound semiconductor substrate of a first conductive type;

a multilayer structure formed on the compound semiconductor substrate, the multilayer structure including at least an active layer for emitting light, a lower cladding layer of the first conductive type and an upper cladding layer of a second conductive type with the active layer interposed therebetween;

an intermediate layer of the second conductive type formed on the multilayer structure; and a current diffusion layer of the second conductive type formed on the intermediate layer, wherein the current diffusion layer and the upper cladding layer have an energy junction relationship of Type II in an energy band profile, and wherein the intermediate layer alleviates a difference in energy positions at at least one of a lower end of a conduction band and an upper end of a valence band in the energy band profile which is exhibited before forming a junction between the upper cladding layer and the current diffusion layer.

2. A semiconductor light emitting device according to claim 1, wherein the intermediate layer includes a plurality of layers.

3. A semiconductor light emitting device according to claim 1, wherein the intermediate layer satisfies at least one of a first energy condition and a second energy condition, the first energy condition being such that an energy position at a lower end of a conduction band of the intermediate layer before the junction formation is positioned between (i) the energy position at the lower end of the conduction band of the upper cladding layer before the junction formation and (ii) the energy position at the lower end of the conduction band of the current diffusion layer before the junction formation, and the second energy condition being such that an energy position at an upper end of a valence band of the intermediate layer before the junction formation is positioned between (i) the energy position at the upper end of the valence band of the upper cladding layer before the junction formation and (ii) the energy position at the upper end of the valence band of the current diffusion layer before the junction formation.

4. A semiconductor light emitting device according to claim 1, wherein the intermediate layer is formed of a plurality of layers from a first intermediate layer in contact with the upper cladding layer to an n-th intermediate layer (n>1) in contact with the current diffusion layer; and compared with a (k+1)-th intermediate layer, a k-th intermediate layer ($1 \leq k \leq (n-1)$) satisfies at least one of a first energy condition and a second energy condition, the first energy condition being such that an energy position at a lower end of a conduction band of the k-th intermediate layer before the junction formation is closer to an energy position at the lower end of the conduction band of the upper cladding layer before the junction formation, and the second energy condition being such that an energy position at an upper end of a valence band of the k-th intermediate layer before the junction formation is closer to the energy position at the upper end of the valence band of the upper cladding layer before the junction formation.

5. A semiconductor light emitting device according to claim 1, wherein the intermediate layer further alleviates a lattice mismatching between the upper cladding layer and the current diffusion layer.

6. A semiconductor light emitting device according to claim 5, wherein a lattice constant of the intermediate layer is a value between a lattice constant of the upper cladding layer and a lattice constant of the current diffusion layer.

7. A semiconductor light emitting device according to claim 5, wherein the intermediate layer is formed of a plurality of layers from a first intermediate layer in contact with the upper cladding layer to an n-th intermediate layer (n>1) in contact with the current diffusion layer; and a value of a lattice constant of a k-th intermediate layer ($1 \leq k \leq (n-1)$) is closer to a value of a lattice constant of the upper cladding layer, compared with a value of a lattice constant of a (k+1)-th intermediate layer.

8. A semiconductor light emitting device according to claim 5, wherein the intermediate layer satisfies at least one of a first energy condition and a second energy condition, the first energy condition being such that an energy position at a lower end of a conduction band of the intermediate layer before the junction formation is positioned between (i) the energy position at the lower end of the conduction band of the upper cladding layer before the junction formation and (ii) the energy position at the lower end of the conduction band of the current diffusion layer before the junction formation, and the second energy condition being such that an energy position at an upper end of a valence band of the intermediate layer before the junction formation is positioned between (i) the energy position at the upper end of the valence band of the upper cladding layer before the junction formation and (ii) the energy position at the upper end of the valence band of the current diffusion layer before the junction formation, and a lattice constant of the intermediate layer is a value between a lattice constant of the upper cladding layer and a lattice constant of the current diffusion layer.

9. A semiconductor light emitting device according to claim 5, wherein the intermediate layer is formed of a plurality of layers from a first intermediate layer in contact with the upper cladding layer to an n-th intermediate layer (n>1) in contact with the current diffusion layer; and compared with a (k+1) in contact with the current diffusion layer; and compared with a (k+1)-th intermediate layer, a k-th intermediate layer ($1 \leq k \leq (n-1)$) satisfies at least one of a first energy condition and a second energy condition, the first energy condition being such that an energy position at a lower end of a conduction band of the k-th intermediate layer before the junction formation is closer to the energy position at the lower end of the conduction band of the upper cladding layer before the junction formation and the second energy condition being such that an energy position at an upper end of a valence band of the k-th intermediate layer before the junction formation is closer to the energy position of the upper end of the valence band of the upper cladding layer before the junction formation, and a value of a lattice constant of the k-th intermediate layer is closer to a value of a lattice constant of the upper cladding layer.

10. A semiconductor light emitting device according to claim 1, wherein a composition of the intermediate layer is sequentially changed from a composition of the upper cladding layer to a composition of the current diffusion layer.

11. A semiconductor light emitting device according to claim 1, wherein the multilayer structure is formed of an AlGaInP type compound semiconductor material, the intermediate layer is formed of an AlInAs type compound semiconductor material, and the current diffusion layer is formed of an AlGaP type compound semiconductor material.

12. A semiconductor light emitting device according to claim 1, wherein the multilayer structure is formed of an AlGaInP type compound semiconductor material, the intermediate layer is formed of a GaAsP type compound semiconductor material, and the current diffusion layer is formed of an AlGaP type compound semiconductor material.

13. A semiconductor light emitting device according to claim 1, wherein both of the multilayer structure and the intermediate layer are formed of AlGaInP type compound semiconductor materials, and the current diffusion layer is formed of an AlGaP type compound semiconductor material.

14. A semiconductor light emitting device according to claim 1, wherein a carrier concentration of the intermediate layer is in the range from about $1 \times 10^{17}$ cm$^{-3}$ to about $1 \times 10^{19}$ cm$^{-3}$.

15. A semiconductor light emitting device according to claim 1, wherein a thickness of the intermediate layer is in the range from about 0.01 μm to about 5 μm.

* * * * *